United States Patent
Rinerson et al.

(10) Patent No.: US 6,243,299 B1
(45) Date of Patent: *Jun. 5, 2001

(54) FLASH MEMORY SYSTEM HAVING FAST ERASE OPERATION

(75) Inventors: Darrell D. Rinerson, Cupertino; Roger R. Lee, Boise; Christophe J. Chevallier, Palo Alto, all of CA (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/244,920

(22) Filed: Feb. 4, 1999

Related U.S. Application Data

(63) Continuation of application No. 09/031,846, filed on Feb. 27, 1998, now Pat. No. 5,917,755.

(51) Int. Cl.[7] .................................................. G11C 16/04
(52) U.S. Cl. .............................. 365/185.29; 365/185.3; 365/185.33; 365/218
(58) Field of Search ........................... 365/185.29, 185.3, 365/185.33, 218

(56) References Cited

U.S. PATENT DOCUMENTS

| | | |
|---|---|---|
| 4,503,524 | 3/1985 | McElroy ............................. 365/218 |
| 4,698,787 | 10/1987 | Mukherjee et al. ................ 365/185 |
| 5,007,691 | 4/1991 | Haddad et al. ..................... 365/218 |
| 5,077,691 | 12/1991 | Haddad et al. ..................... 365/218 |
| 5,187,689 | 2/1993 | Gill et al. ....................... 365/185.29 |
| 5,216,588 | 6/1993 | Bajwa et al. ......................... 363/60 |
| 5,222,040 | 6/1993 | Challa ................................. 365/185 |
| 5,313,429 | 5/1994 | Chevallier et al. ................. 365/226 |
| 5,561,620 | 10/1996 | Chen et al. ......................... 365/218 |
| 5,579,274 | 11/1996 | Van Buskirk et al. ............. 365/208 |
| 5,638,327 | 6/1997 | Dallabora et al. .............. 365/185.33 |
| 5,680,349 | 10/1997 | Atsumi et al. .................. 365/185.23 |
| 5,781,477 | 7/1998 | Rinerson et al. ............... 365/185.29 |

*Primary Examiner*—Son T. Dinh
(74) *Attorney, Agent, or Firm*—Schwegman, Lundberg, Woessner & Kluth, P.A.

(57) ABSTRACT

A flash memory system powered by an external primary voltage source, with the system including an array of flash memory cells arranged in rows and columns, with each of the cells including a source region, a drain region, a channel region intermediate the drain and source region, a floating gate disposed over the channel region and a control gate disposed over the floating gate, with the cells located in one of the array columns having their drains connected to a common bit line and with the cells in one of the rows having their control gates connected to a common word line. The memory system includes a control circuit carrying out read, programming and erase operations. The erase operation is performed by applying a negative voltage to control gate of the cell being erased and a positive voltage to the source of the cells being erased. The positive voltage is greater in magnitude than the external primary voltage source and is preferably produced utilizing a charge pump circuit powered by the primary voltage source. The relatively large source voltage enables the cell to be erased rapidly and with a reduced tendency to produce positive charges which can be trapped in the gate oxide intermediate the floating gate and the channel/source of the cell.

11 Claims, 6 Drawing Sheets

FLASH MEMORY SYSTEM HAVING FAST ERASE OPERATION

This application is a continuation of U.S. Ser. No. 09/031,846 filed Feb. 27, 1998, U.S. Pat. No. 5,917,755.

BACKGROUND OF THE INVENTION

1. Field of the Invention

The present invention relates generally to memory systems and in particular to a flash memory system having a fast erase operation.

2. Background Art

Non-volatile memory systems have become increasingly popular, especially flash memory systems. FIG. 1 shows a typical prior art flash memory cell 10. The cell 10 is formed in a P type substrate 12. A double diffused source region includes an inner N+ type diffusion 11 and an outer N type diffusion 15. A single drain diffusion 16 of N+ material is formed in the substrate and spaced apart from the source diffusions 11, 15 to form an intermediate channel region 12a.

A floating gate 18, typically made of doped polysilicon, is disposed over the channel region 12a. The floating gate 18 is electrically isolated from the other cell elements by oxide, including a thin (100 Å) gate oxide 20 intermediate the floating gate 18 and the channel region 12a. A control gate 22 is disposed over the floating gate 18 and is also made of doped polysilicon. Control gate 22 is separated from the floating gate 18 by an interpoly dielectric layer 24.

Table 1, below, shows the conventional approach to the programming, reading and erasing (two approaches) of a flash memory cell. The voltages are based upon the assumption that the primary supply voltage $V_{CC}$ for the memory is +5 volts. The conditions for programming

TABLE 1

|  | PROGRAM | READ | ERASE ONE | ERASE TWO |
|---|---|---|---|---|
| CONTROL GATE | +12 volts | +5 volts | GROUND | −10 to −17 volts |
| DRAIN | +6 to +9 volts | +1 volts | FLOAT | FLOAT |
| SOURCE | GROUND | GROUND | +12 volts | +5 volts |
| SUBSTRATE | GROUND | GROUND | GROUND | GROUND | call for the application of a high positive voltage $V_G$, such as +12 volts, to the control gate 22 of the cell 10. In addition, a moderate positive voltage $V_D$ of +6 to +9 volts is applied to the drain 16 and the source 11, 15 voltage $V_S$ is at ground level, as is the substrate voltage $V_{SUB}$. The current requirements for the +12 volts applied to the control gate 22 and the +6 to +9 volts applied to the drain region 16 are relatively small, this being due in part to the fact that only a few flash cells are ever programmed at one time. Thus, these voltages can be generated on the integrated circuit utilizing charge pump circuitry which is powered by the primary supply voltage $V_{CC}$.

The above conditions result in the inducement of hot electron injection in the channel region 12a near the drain region 16 of the cell. These high energy electrons travel through the thin gate oxide 20 towards the positive voltage present on the control gate and collect on the floating gate 18. These electrons will remain on the floating gate and will function to reduce the effective threshold voltage of the cell as compared to a cell which has not been programmed.

Table 1 also shows the conditions for reading cell 10. The control gate voltage $V_G$ is connected to the primary supply voltage $V_{CC}$ of +5 volts. In addition, the drain voltage $V_D$ is set to a small positive voltage of +1 volts and the source voltage $V_S$ is set to ground potential. If the cell 10 were in a programmed state, the excess electrons present on the floating gate would have increased the threshold voltage to a value in excess of +5 volts. Thus, the control gate $V_G$ to source voltage $V_S$ of +5 volts would not be sufficient to turn on cell 10. The resultant lack of cell current would indicate the programmed state of the cell. If cell 10 were in an erased state, the threshold voltage of the cell would be substantially below +5 volts. In that case, the cell 10 would conduct current which would be sensed by a sense amplifier (not depicted) thereby indicating that the cell is in the erased state.

Table 1 shows two exemplary conventional alternative sets of conditions for erasing a flash cell. In the first example, the control gate 22 voltage $V_G$ is grounded and the drain region 16 is left floating (open). The source region voltage $V_S$ is connected to a large positive voltage of +12 volts. When these conditions are applied to the cell 10, a strong electric field is generated between the floating gate 18 and the source region 11, 15. This field causes the electrons on the floating gate 18 to be transferred to the source region 11, 15 by way of Fowler-Nordheim tunneling, sometimes called cold electron injection.

The above conditions for erasing a cell have been viewed by others as disadvantageous in that the large positive voltage (+12 volts) applied to the source region is difficult to implement in an actual memory system. First, the primary supply voltage $V_{CC}$ in a typical integrated circuit memory system is +5 volts and is provided by an external power supply such as a battery. Thus, one approach would be to include a charge pump on the memory integrated circuit which is also powered by the primary supply voltage $V_{CC}$. However, a typical integrated circuit memory system may include a million or more cells all or a very large group of which will be erased at the same time. Thus, the charge pump circuit must be capable of providing relatively large amounts of current on the order of 20 to 30 milliamperes. This has been viewed by others as impractical thus necessitating the use of an a second external supply voltage for producing the +12 volts applied to the source region. This would typically preclude battery powered operation where multiple batteries, such as a +5 volt primary supply battery and a +12 volts battery, is not practical.

The application of the relatively high voltage of +12 volts has also been viewed as disadvantageous in that there was believed to be a tendency to produce high energy holes ("hot" holes) at the surface of the source region 11, 15 near the channel region 12a. These positive charges were said to have a tendency to become trapped in the thin gate oxide 20 and eventually migrate to the floating gate and slowly neutralize any negative charge placed on the floating gate during programming. Thus, over time, the programmed state of the cell may be altered. Other deleterious effects due to the presence of holes have been noted, including the undesired tendency to program non-selected cells.

The above-described disadvantages of the erase conditions set forth in Table 1 (Erase 1) have been noted in U.S. Pat. No. 5,077,691 entitled FLASH EEPROM ARRAY WITH NEGATIVE GATE VOLTAGE ERASE OPERATION. The solution in U.S. Pat. No. 5,077,691 is summarized in Table 1 (Erase 2). A relatively large negative voltage ranging from −10 to −17 volts is applied to the gate 22 during an erase operation. In addition, the primary supply voltage $V_{CC}$ of +5 volts (or less) is applied to the source region 11, 15. The drain region 16 is left floating.

Although the source current remains relatively high, the voltage applied to the source is sufficiently low that the +5 volt primary supply voltage $V_{CC}$ can be used directly or the source voltage may be derived from the primary supply voltage using a resistive divider and associated buffer. In either event, since the source voltage is equal to or less than the primary supply voltage, the large source currents required in erase operations can be provided without the use of charge pump circuitry. The high impedance control gate 22 of the flash cell draws very little current. Accordingly, the large positive voltage applied to the control gate 22 in the erase operation can be provided by a charge pump circuit. Thus, according to U.S. Pat. No. 5,077,691, only a single external power supply, the +5 volt supply for $V_{CC}$, need be used.

In addition, the use of a relatively small source voltage equal to voltage $V_{CC}$ or less is said to decrease the magnitude of the source 11, 15 to substrate 12 voltage. This is said to reduce the tendency for the generation of "hot" holes during erase and the resultant hole trapping.

There has been a tendency to reduce the magnitude of the primary supply voltage $V_{CC}$ so that low power battery operation may be achieved. It is now common to utilize primary supply voltages that are +3.3 volts or smaller as compared to the previous +5 volt standard. However, the speed of the erase operation is determined primarily by the strength of the electric field between the source region and the floating gate. The erase speed is, in fact, exponentially related to the strength of the electric field.

When the magnitude of source voltage $V_S$ is decreased due of the use of smaller values of primary supply voltage $V_{CC}$, one could attempt to compensate for the decrease in source voltage by increasing the. magnitude of the negative voltage $V_G$ applied to the control gate. However, the increase in magnitude in the control gate voltage $V_G$ must be greater than the decrease in magnitude of the source voltage $V_S$ because the coupling coefficient between the control gate 22 and the floating gate 18 is less than unity. Thus, for every one volt reduction in source voltage it is necessary to increase the magnitude of the control gate voltage by roughly 1.6 to 2 volts in order to maintain the same field strength. However, it is difficult to implement a charge pump which is capable of developing a large negative voltage, especially with the now common practice of reducing the primary supply voltage $V_{CC}$ to +3.3 volts. Accordingly, the approach disclosed in U.S. Pat. No. 5,077,691 results in reduced erase speeds when the primary supply voltage $V_{CC}$ is reduced in magnitude.

The present invention overcomes the above disadvantages of the prior art. It is possible to achieve operation on a single external voltage supply $V_{CC}$, even for low values of $V_{CC}$ without sacrificing erase speed. These and other advantages of the present invention will be apparent to those skilled in the art upon a reading of the following Detailed Description of the Invention together with the drawings.

SUMMARY OF THE INVENTION

A flash memory system powered by an external primary voltage source is disclosed. The system including an array of flash memory cells arranged in rows and columns, with each of the cells including a source region, a drain region, a channel region intermediate the drain and source region, a floating gate disposed over the channel region and a control gate disposed over the floating gate, with the cells located in one of the array columns having their drains connected to a common bit line and with the cells in one of the rows having their control gates connected to a common word line. The memory system further includes control means for carrying out read, program and erase operations. The erase operation is performed by applying a negative voltage to control gate of the cell being erased and a positive voltage to the source of the cell being erased. The positive voltage is greater in magnitude than the external primary voltage source and is preferably produced utilizing a charge pump circuit powered by the primary voltage source. The relatively large source voltage enables the cell to be erased rapidly and with a reduced tendency to produce positive charges which can be trapped in the gate oxide intermediate the floating gate and the channel/source of the cell.

DETAILED DESCRIPTION OF THE INVENTION

Figure 1:
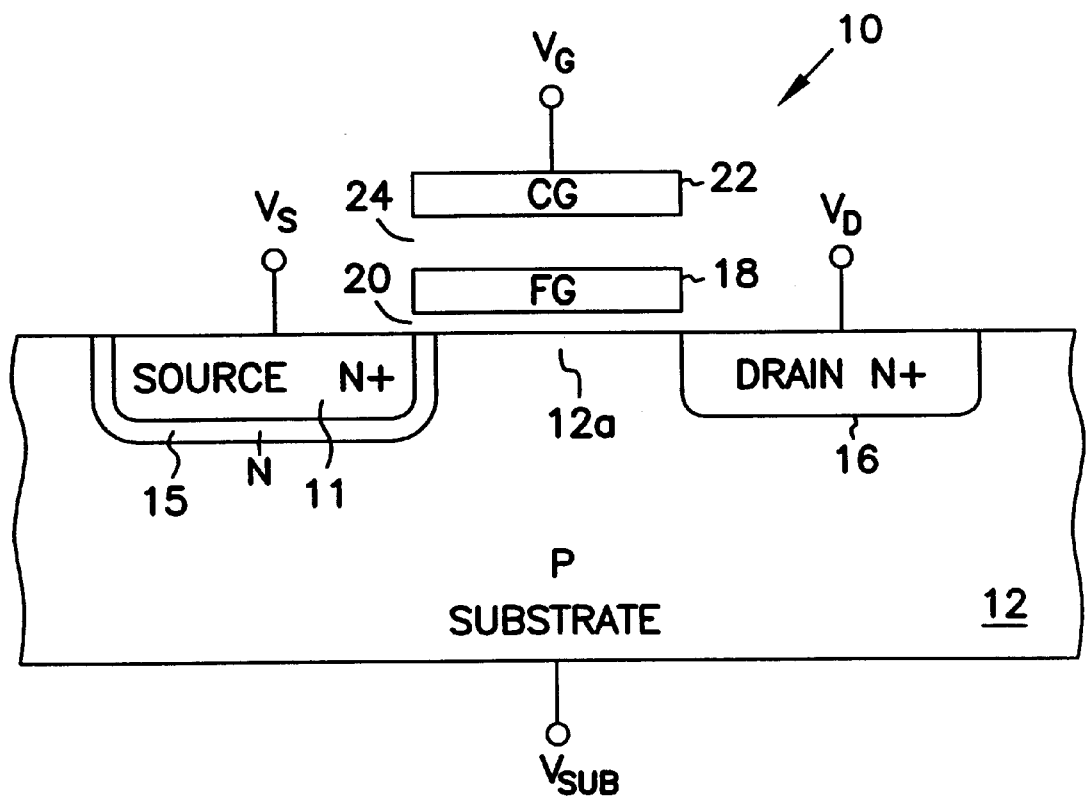
FIG. 1 is a diagram of a conventional flash memory cell.
Figure 2:
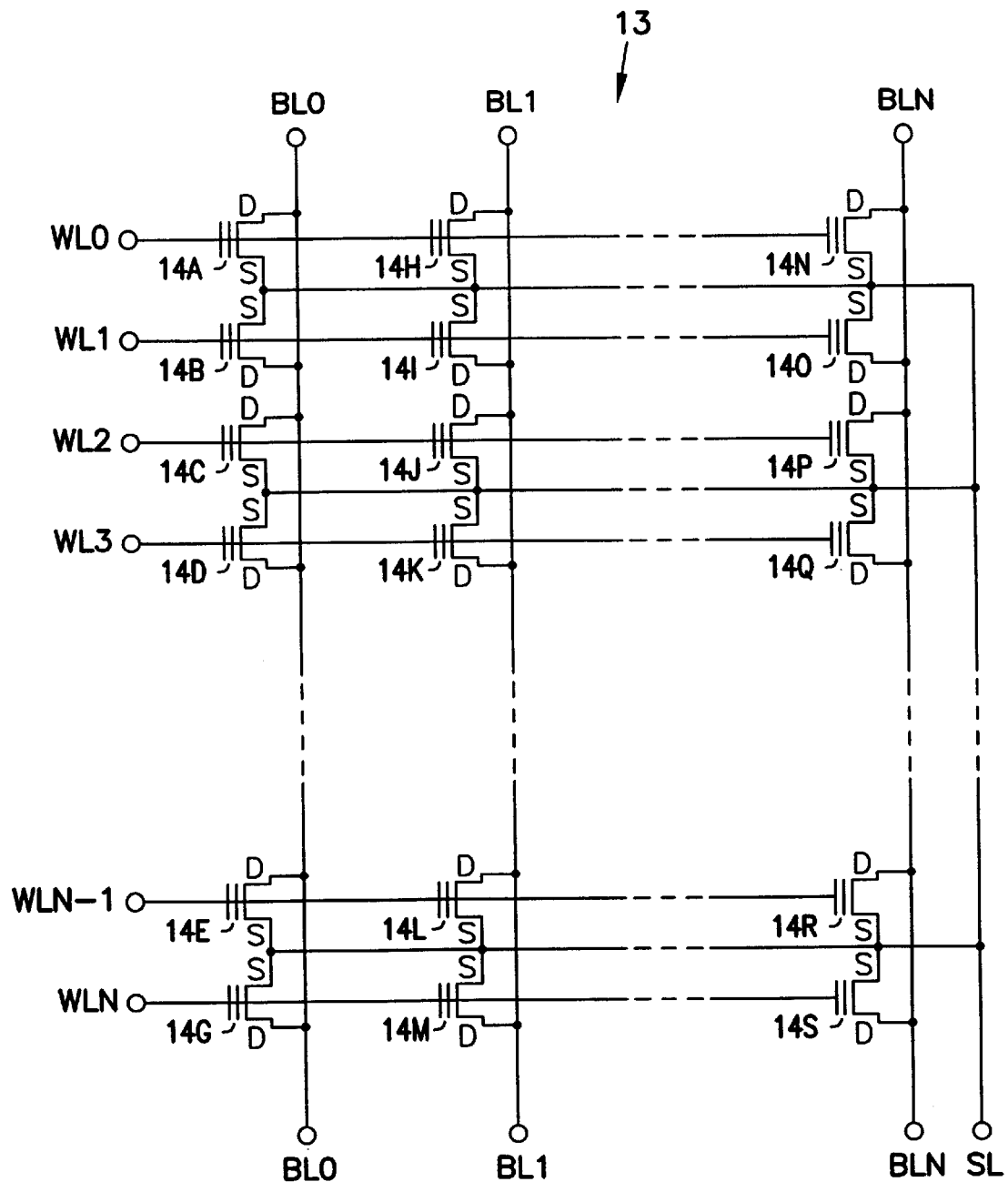
FIG. 2 is a diagram of a conventional flash memory array.

Referring again to the drawings, FIG. 2 shows a conventional flash memory array 13 suitable for use in the present invention. The cells 10 of FIG. 1 can be used for use in array 13, although the double diffused source region 11, 15 is not required and may be eliminated to decrease the size of the cells. The cells 14 of array 13 are arranged in rows and columns. All of the cells 14 in a particular column have their drain regions connected to a common bit line BLN and all of the cells in a particular row have their control gates connected to a common word line WLN. All of the cells in the array have their sources connected to a common source line SL. As will be explained in connection with FIG. 3, it is possible to arrange the cells into array segments having separate source lines that can be sequentially accessed during an erase cycle so as to reduce the maximum erase current.

The cells 14 of array 13 are arranged in column pairs, with each cell of the pair sharing a common source region. By way of example, cell pair 14J and 14K have a common source region connected to the source line SL. The drain regions of the cells are connected to the bit line BLN associated with the column in which the cells are located. By way of example, cell pair 14J and 14K have their drain regions connected to common bit line $B_{L1}$.

Figure 3:
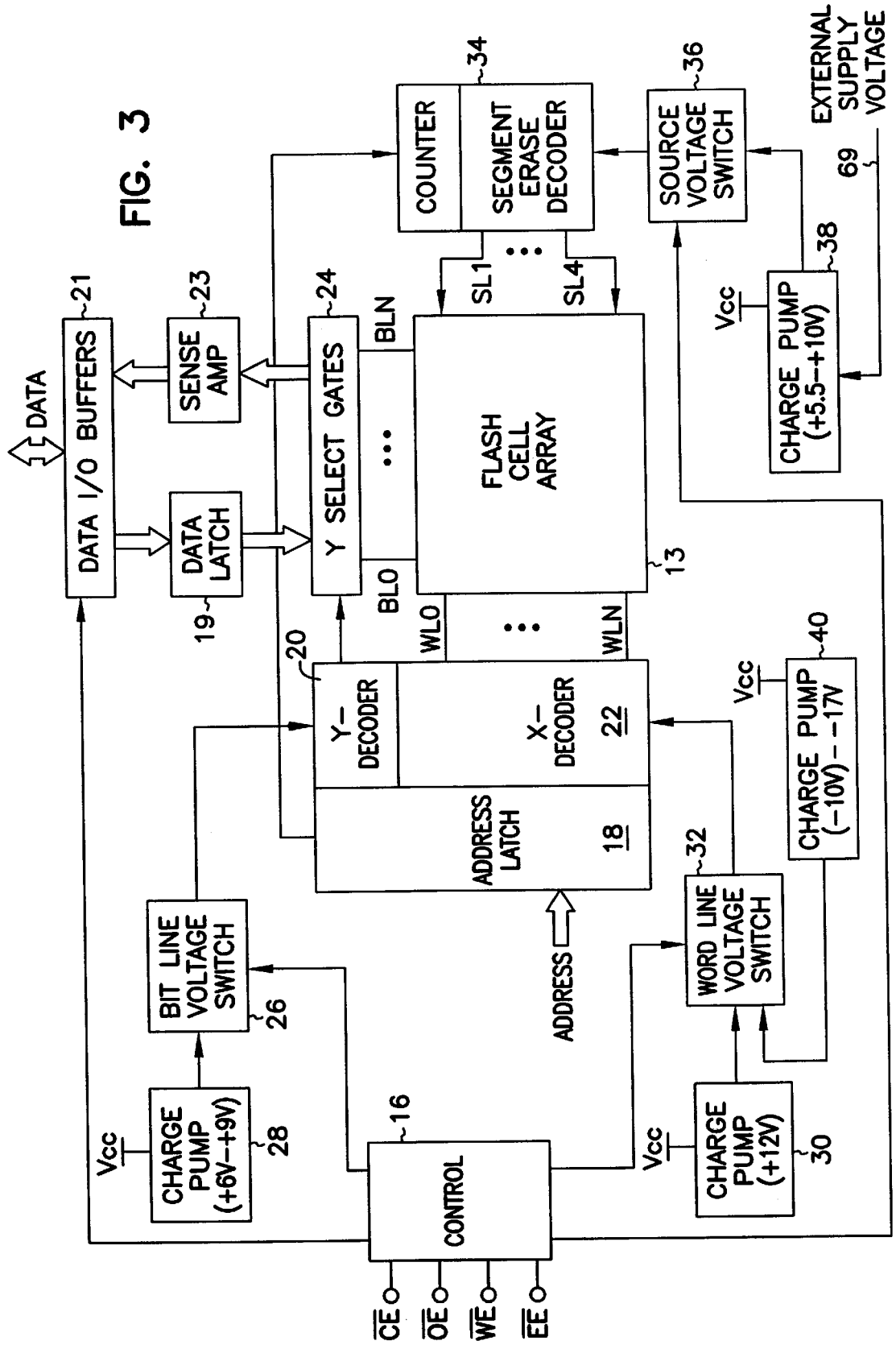
FIG. 3 is a diagram of a memory system in accordance with the present invention.

FIG. 3 shows a flash memory system in accordance with the present invention. The system utilizes the flash cell array 13 of FIG. 2, except the array is arranged into four erase segments. The erase segments have separate source lines SL1, SL2, SL3 and SL4 so that each segment can be separately accessed during and erase cycle to reduce the maximum erase current as will be explained. Preferably, the memory system is powered by a single external primary power source which provides voltage $V_{CC}$. The phrase primary power source, as opposed to other power sources, is defined to mean the power source which provides at least one-half of the power (E×I) to the memory system during a read operation.

Table 2 below shows the various conditions for carrying out program, read and erase operations for the FIG. 3 memory system. Operation of the memory is controlled by a control block 16 which contains the various circuitry for operating the memory system which may included, by way of example, a state machine. The details for implementing the control block 16 are conventional and well known in the art and therefore will not be described. When a word is to be programmed, a chip enable signal $\overline{CE}$ and a write enable signal $\overline{WE}$ are both made active (low) and an erase enable signal $\overline{EE}$ is made inactive (high) by an external device such as a processor. The data that are to be programmed (typically an eight or sixteen bit word) and the address for the data are also provided by the external device. The address is stored in an address latch 18 and the data to be programmed are stored in a data latch 19 by way of a Data I/O buffer unit 21.

TABLE 2

|  | PROGRAM | READ | ERASE |
|---|---|---|---|
| SELECTED WORD LINE | +12 VOLTS | $V_{CC}$ (+5 volts) | −10 TO −17 VOLTS |
| DESELECTED WORD LINE | GROUND | GROUND | −10 TO −17 VOLTS |
| SELECTED BIT LINE | +6 TO +9 VOLTS | +1 VOLTS | FLOAT |
| DESELECTED BIT LINE | GROUND | FLOAT | FLOAT |
| SELECTED SOURCE LINE | GROUND | GROUND | >$V_{CC}$ |
| DESELECTED SOURCE LINE | GROUND | GROUND | GROUND |

Part of the address bits in the latch 18 are forwarded to a Y decoder circuit 20 and the remaining bits are forwarded to an X decoder circuit 22. The Y decoder circuit will activate certain gates of a Y select gates unit based upon that part of the address received by the Y decoder circuit 20. The control block 16 also causes a voltage switch 26 to connected the output of a conventional charge pump circuit 28 to the Y decoder circuit 20. The Y select gates unit 24 will connect the output of the charge pump circuit 28 to selected ones of the bit lines BLN of the array 13 based upon the, address and based upon the data to be programmed.

As can be seen from Table 2 above, the cells are programmed by applying a voltage ranging from +6 to +9 volts to the bit line associated with the cell. This voltage is typically derived from the primary supply voltage $V_{CC}$ by the charge pump circuit 28. If the bit of the word is a logic "0", the corresponding cell of the word is to be programmed, therefore the voltage is connected to the associated (selected) bit line BLN. If the cell of the word is a logic "1", the cell is to remain in an erased state and the associated bit line is grounded. In addition, if cell is associated with a deselected bit line BLN, the deselected bit line is grounded as indicated in Table 2.

The word line WLN associated with the word being programmed is connected to +12 volts, as also indicated by Table 2. This voltage is produced by a further charge pump circuit 30 and is forwarded to the X decoder circuit 22 by way of word line switch 32. The deselected word lines are connected to ground, as also indicated by Table 2. Finally, a segment erase decoder unit 34 functions to connect the selected and deselected source lines SL1 to SL4 to ground.

With the above-described conditions, the selected cells of the word stored in data latch 18 will be programmed into the memory system.

If a word is to be read, the write enable $\overline{WE}$ and erase enable $\overline{EE}$ signals are made inactive (high) and the chip enable $\overline{CE}$ signal is made active (low). The output enable signal $\overline{OE}$ is also made active (low). The address of the word to be read is forwarded to the address latch 18 and then to the Y decoder circuit 20 and the X decoder circuit 22. The word line switch 32, together with the X decoder circuit 22 causes the primary supply voltage $V_{CC}$, such as +5 volts, to be applied to the selected word line WLN, as shown in Table 2. In addition, the deselected word lines are grounded.

The remaining address bits cause the Y decoder unit 20 to direct the Y select gates unit 24 to apply a small positive voltage of about +1 volts to each of the bit lines associated with the word to be read. In addition, the sense amplifiers of unit 23 are connected to the selected word lines by the Y select gates unit 24 and the source lines SLN for the cell block in which the word is located is grounded by the segment erase decoder unit 34.

If a cell being read happens to be in an erased state, the threshold voltage will be significantly less than +5 volts so that the cell will conduct current during the read operation. This current flow will be detected by the associated sense amplifier unit 23 which will produce a logic "1" output indicating the erased state of the cell. In the event the cell being read is in a programmed state, the threshold voltage will be sufficiently high so that no cell current will flow. In that event, the associated sense amplifier will indicate that the cell is in a programmed state and produce a logic "0" output. The outputs of the sense amplifier unit 23 are forwarded to the data I/O buffer unit 21.

Table 2 shows the conditions for erasing the memory. As previously noted, the subject memory system contains four memory cell segments having separate common source lines SL1 through SL4. In many memory systems, a set of special commands must be received by the memory prior to commencement of an erase operation so as to minimize the possibility of an accidental erase operation. In the present example, the control block 16 is simply implemented to commence an erase operation when an erase enable signal $\overline{EE}$ provided by the processor goes active (low). In addition, signal $\overline{CE}$ is made active (low) and signals $\overline{OE}$ and $\overline{WE}$ are "don't care." Circuitry which can be used for carrying out this negative gate erase operation is disclosed an application, the contents of which are fully incorporated into the present application by reference, which was filed on the same date as the present application and entitled "Segmented Non-Volatile Memory Array With Multiple Sources Having Improved Source Line Decode Circuitry".

When the memory is to be erased, the processor provides an address of any word located in the array. The segment erase decoder unit 34 responds to the address by connecting the source lines SL1 through SL4 to the source voltage switch 36 output. The Segment Erase Decoder unit 34 has a counter which can be incremented so that all four of the source lines SL1 through $S_{L4}$ can be sequentially selected so as to permit the entire array to be erased. As will be explained, this sequential selection reduces the magnitude of the current drawn by the array during an erase operation.

The input of the source voltage switch 36 is connected to receive the output of a charge pump circuit 38 which produces an output voltage derived from the primary supply voltage $V_{CC}$. The charge pump circuit 38, which is conventional in construction, adds a fixed voltage to the primary supply voltage $V_{CC}$. The fixed voltage can vary from +0.5 to +5 depending on the magnitude of voltage $V_{CC}$ so that the charge pump circuit 38 erase voltage output may range from +5.5 volts to +10 volts if $V_{CC}$ is at +5 volts. Alternatively, the erase voltage applied to the source lines SLN can be provided by an external voltage source, although it is generally preferred that a charge pump circuit be used so that only one external supply is needed. As will be explained, the external supply voltage can be voltage $V_{CC}$.

When the array is to be erased, the source line SL1 is first connected to the output of the charge pump circuit 38. The other source lines SL2, SL3 and SL4 are connected to ground. In addition, all of the bit lines BLN are left floating and all of the word lines are connected to −10 to −17 volts generated by charge pump 40 circuit. As will be explained in greater detail in connection with FIG. 7, the other source lines are then sequentially connected to the charge pump circuit 38 so that the entire array is erased. Alternatively, the selected bit lines can be coupled to a small positive voltage, such as +1 to +2 volts, during the erase.

These erase conditions result in all of the cells located in the array 13 to be erased. Since the voltage applied to the sources is relatively large, the strength of the electric field in the gate oxide in the region near the source is increased. This significantly reduces the time required to complete an erase as compared to conventional erase techniques, previously described, where the voltage applied to the source region is limited to the primary supply voltage $V_{CC}$ or less. In addition, this increase in erase speed does not require a control gate voltage (word line voltage) which is so large in magnitude that it is difficult or impossible to fabricate a charge pump capable of generating such gate voltage. Further, the fast erase is accomplished with a reduced tendency to generate positive charges (hot holes) in comparison to those conventional techniques previously described that utilize a grounded control gate and a large positive voltage applied to the source.

Figure 6:
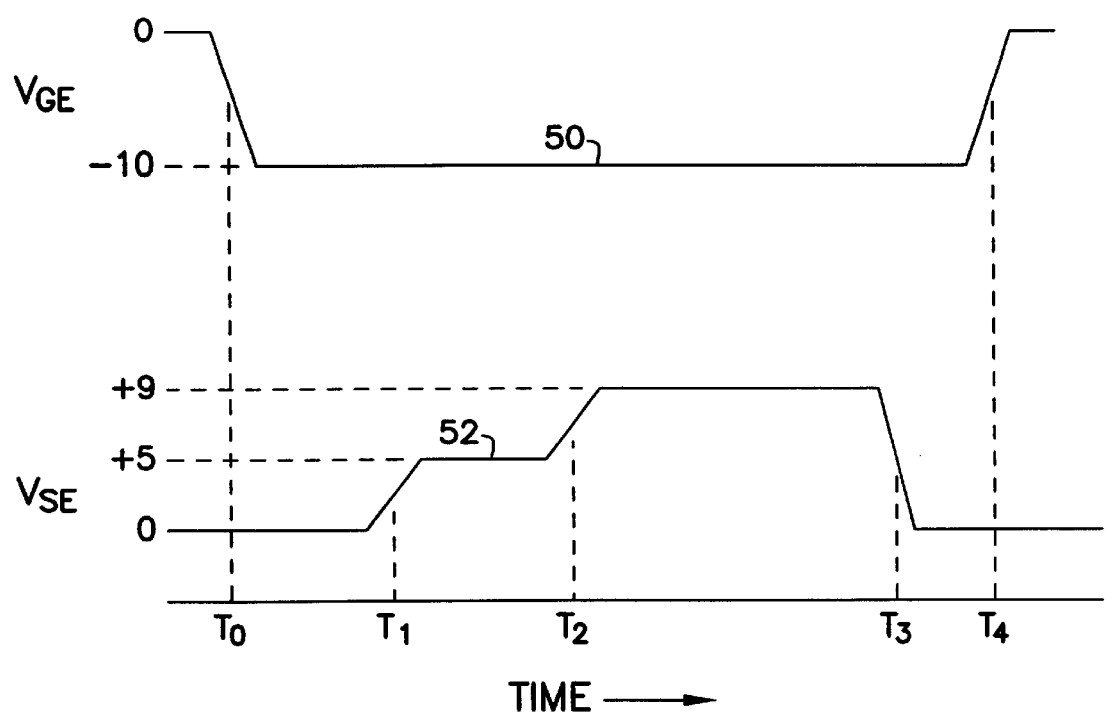
FIG. 6 is a timing diagram showing the relative timing of the application of the gate and source voltages during an erase operation.

It is preferred that the erase voltages be applied to the source lines SL in a stepped manner, as indicated is by the timing diagram of FIG. 6 (which is not drawn to scale). In addition, as shown in the timing diagram of FIG. 7, it is preferred that, at least in the initial portion of the erase cycle, the four erase segments associated with the source lines SL1, SL2, SL3 and SL4 be erased sequentially.

The control gate erase voltage $V_{GE}$, represented by waveform 50 of FIG. 6, is applied to the word lines WLN of the array 13, and is initially at ground potential prior to time $T_0$. The source erase voltage $V_{SE}$, represented by waveform 52 and which is applied to the source lines SLN of the array, is also initially at ground potential. When an erase operation is commenced at approximately time $T_0$, the gate erase voltage $V_{GE}$ is brought down to a negative voltage, such as −10 volts, as previously discussed. The source erase voltage $V_{SE}$ remains at ground potential until time $T_1$. During the interval from time $T_0$ to time $T_1$, the cells are erased slightly at a very slow rate. This interval is selected to permit charge pump circuit 40 which generates the gate erase voltage $V_{GE}$ to cause the voltage reach −10 volts and to stabilize at that level. Typically, the interval from time $T_0$ to $T_1$ is on the order of 1 to 10 microseconds.

At time $T_1$, the source erase voltage $V_{SE}$ is increased from ground to the primary supply voltage $V_{CC}$ of +5 volts. At this stage of the erase cycle, the cells will draw a substantial amount of current followed by a reduce amount of current in the remainder of the cycle. The initial surge or spike in current, which may be on the order of 20 to 30 milliamperes, is due primarily to the reverse biased diode current flow, sometimes referred to as gated diode current, from the source to the substrate which is grounded. Initially, the strength of the electric field is relatively large due to the presence of electrons on the floating gate at the start of the erase cycle. The strength of the field decreases as the electrons are removed from the floating gate thereby reducing the magnitude of the current. In addition, the initial spike of cell current is due to the presence of a source capacitance which must be charged. Further, tunneling current contributes to this initial current spike.

At time $T_2$, the source erase voltage is increased from $V_{CC}$ (+5 volts) to +9 volts. The +9 volts is generated by charge pump circuit 38 (FIG. 3). It is preferable that, during the time interval from $T_1$ to $T_2$, the source voltage $V_{SE}$ be provided by the primary power source of the memory that provides voltage $V_{CC}$ as opposed to a charge pump circuit or the like powered by the primary power source. The primary power source will have the capability of providing the large amount of current required in the initial stage of the erase cycle in a short amount of time. The time interval from $T_1$ to $T_2$ should be at least approximately on the order of 1 microsecond. The duration is preferably longer, typically long enough so that the cell current is sufficiently small that is can be easily provided by charge pump circuit 38. Depending upon many factors including the size of the array being erased and upon the current drive capability of the charge pump circuit 38, the duration may be on the order of 10 milliseconds.

The word lines WLN and source line SLN are held at these voltages until time $T_3$. At this time, the source erase voltage $V_{SE}$ is returned to ground potential. At time $T_4$, the gate erase voltage $V_{GE}$ is returned to ground potential. The duration of the time period from $T_2$ to $T_3$ is typically on the order of 100 microseconds to 1 millisecond depending upon many factors including the construction of the cells 10 being erased such as the gate oxide 20 thickness, the coupling ratio between the control gate and the channel and the magnitude of the voltages $V_{GE}$ and $V_{SE}$. In addition, the time Interval is a function of the number of cells located in the array being erased.

As can be seen from the FIG. 6 timing diagram, the voltage applied to the control gate (word lines), $V_{GE}$, and the voltage applied to the source (source line) of the cells are applied in a sequential manner rather than simultaneously. Voltage $V_{GE}$ is applied at time $T_0$ prior to the application of $V_{SE}$ and is removed subsequent to the removal of voltage $V_{SE}$ at time $T_4$. This staged application of voltages eliminates the sudden application of a strong electric field to the cells and thereby reduces the voltage stresses on the cells, particularly on the gate oxide 20. Thus, the endurance of the cells is increased allowing the cells to be programmed and erased an increased number of times.

Figure 7:
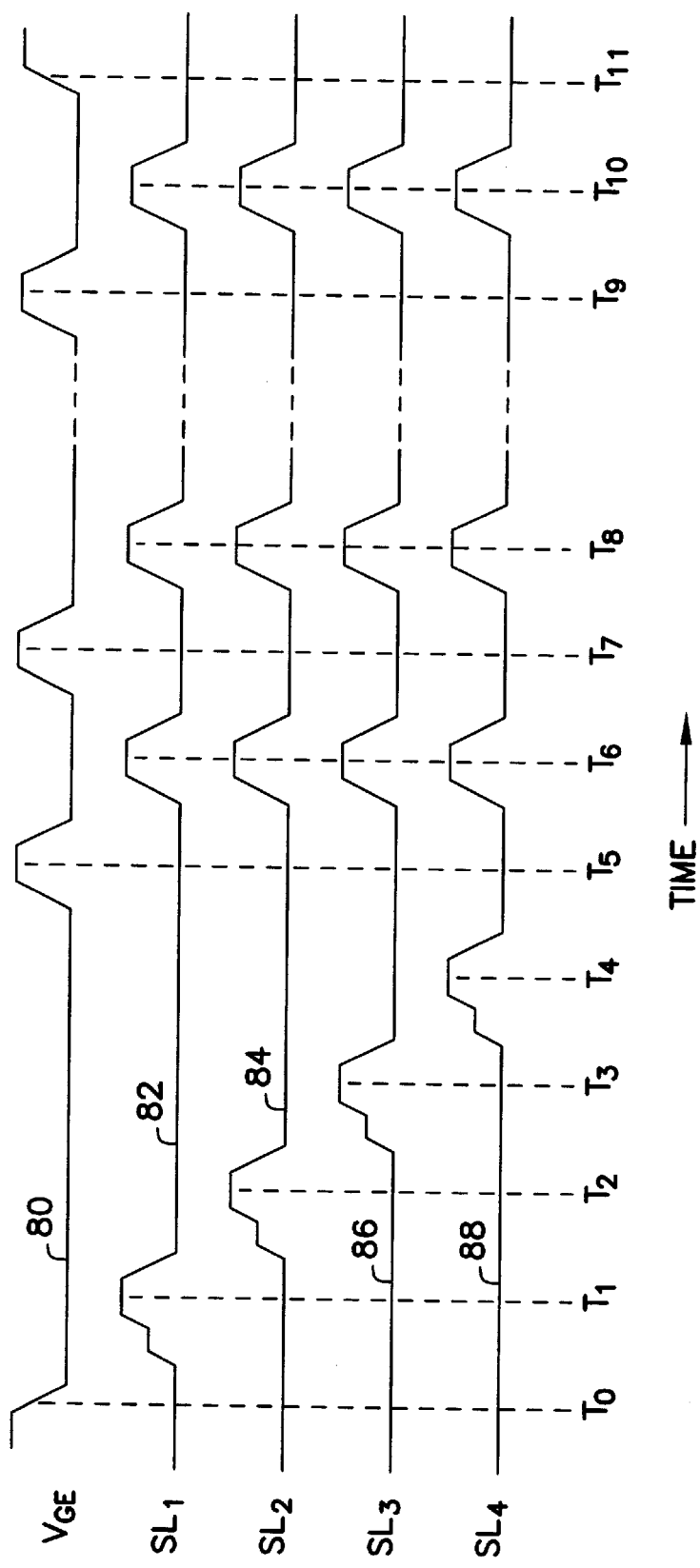
FIG. 7 is a timing diagram showing the sequential application of gate and source voltages to the various erase segments of an array during an erase operation.

As previously noted, and as is well known, multiple erase pulses are used in an individual erase sequence. Waveform 52 of the FIG. 6 timing diagram represents a single erase pulse. The timing diagram of FIG. 7 shows an exemplary erase sequence for an array 13 having four erase segments with separate source lines SL1, SL2, SL3 and SL4, respectively. A common gate erase voltage $V_{GE}$ is applied to all of the word lines of the four erase segments of the array.

As indicated by waveform 80 of the FIG. 7 timing diagram, the beginning of an erase sequence is initiated by dropping the common gate erase voltage $V_{GE}$ from ground level to a negative voltage such as −10 volts shown by waveform 50 of FIG. 6. This gate erase voltage $V_{GE}$ is applied to all of the word lines of the array 13. Next, a positive erase voltage pulse is applied to a first one of the source lines at time $T_1$, such as source line SL1, as indicated by waveform 82 of FIG. 7. This represents a single erase pulse having the duration and magnitudes shown and described in connection with waveform 52 of FIG. 6. Note that the initial erase current is substantially reduced since the positive source voltage $V_{SE}$ is applied to only one segment of the array 13 by way of source line SL1, with each erase segment containing only one-fourth of the cells of the array.

Subsequent to the termination of the first erase pulse applied to source line SL1, an erase pulse is applied to source line SL2 of the second erase segment at time $T_2$. Again, the erase pulse has the same duration and magnitudes as shown and described in connection with waveform 52 of FIG. 6. Preferably, the voltage applied to the word lines, voltage $V_{GE}$, remains at −10 volts. A further erase pulse is applied to source line SL3 of the third erase segment at time $T_3$ and a further erase pulse is applied to source line SL4 of the fourth erase segment at time $T_4$. Thus, it can be seen that the erase pulses are preferably applied sequentially so that the maximum current drawn at any one time is reduced.

Once all of the erase segments of array 13 have received a single erase pulse, the cells are sufficiently erased so that the large initial erase currents no longer need to be provided to the cells. Accordingly, all subsequent erase pulses can be provided to all of the erase segments at one time to speed up the erase sequence. Thus, the source line voltage $V_{SE}$ will switch from ground potential directly to +9 volts rather than from ground to +5 volts, at +5 volts for a significant amount of time and then to +9 volts. For example, at time $T_6$, an erase pulse of −10 volts is applied to all source lines SL1, SL2, SL3 and SL4. Prior and subsequent to the application of the erase pulses, the word line voltages, $V_{GE}$ are brought back to ground potential as indicated by waveform 80 at times $T_5$ and $T_7$ so as to reduce the stress on the cells, as previously described.

As is well known, the total number of erase pulses needed to erase all of the cells is dependent upon many factors. In most cases an erase algorithm is used wherein the cells are periodically tested in a manner similar to a read operation to determine whether the cells have been adequately erased. If the cells have not been adequately erased, additional erase pulses are applied.

Figure 4:
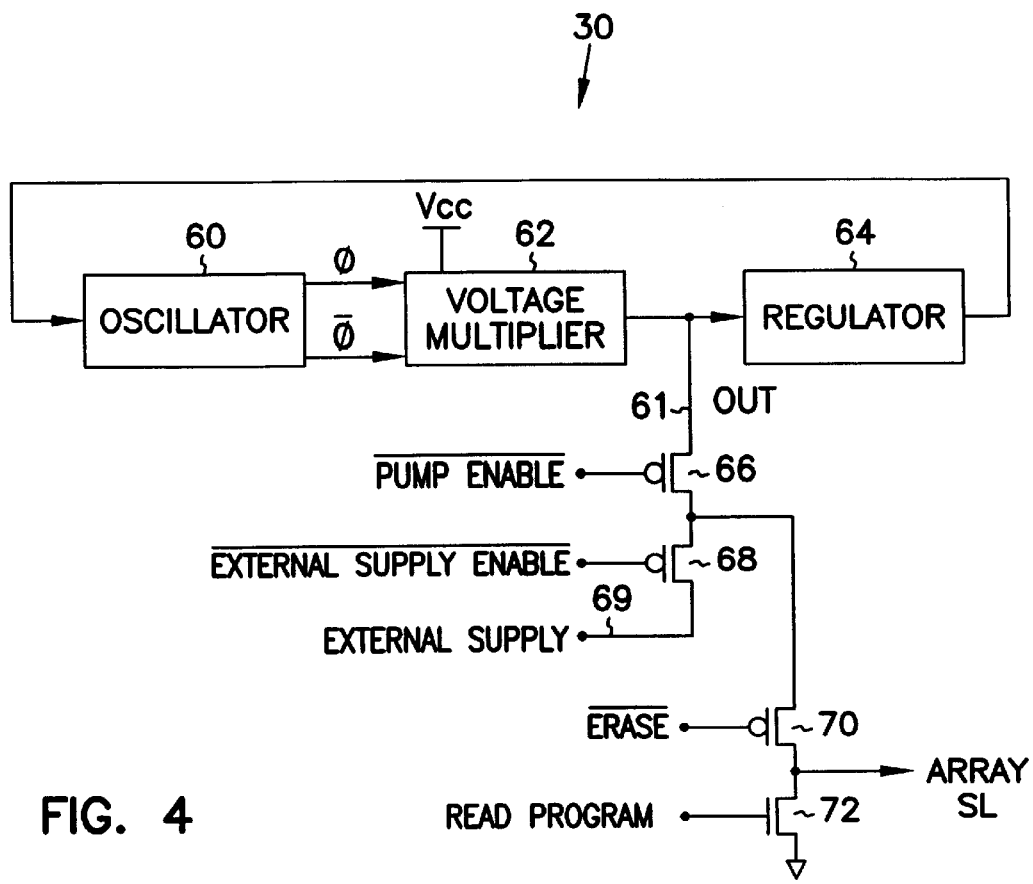
FIG. 4 is a charge pump circuit suitable for generating one of the erase voltages to be used by the subject memory system.

The charge pumps used in the subject memory system of FIG. 3 are conventional in construction. FIG. 4 shows one exemplary implementation of the charge pump circuit 38 of the FIG. 4 memory system. The charge pump 38 includes an oscillator section 60 for generating appropriate complementary timing signals $\phi$ and $\bar{\phi}$. Oscillator section 60 can be any type of ring or relaxation oscillator.

Figure 5:
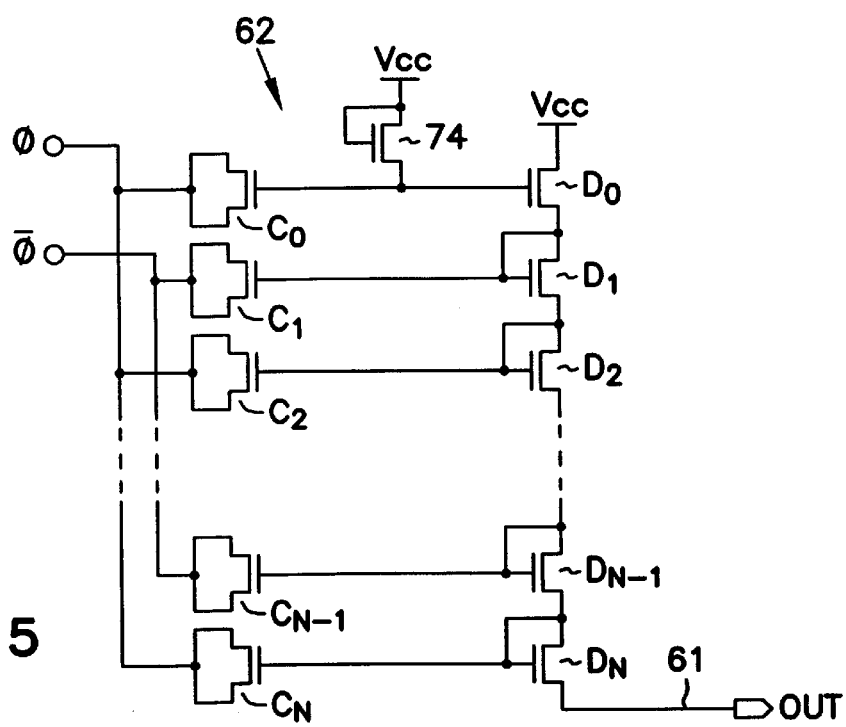
FIG. 5 is a schematic diagram of a voltage multiplier circuit for use in the charge pump circuit of FIG. 4.

A voltage multiplier section 62 is provided for receiving the timing signals and producing a positive voltage exceeding the primary supply voltage $V_{CC}$ by +0.5 to +5 volts. By way of example, when $V_{SE}$ is to be +9 volts at time $T_2$ (FIG. 6), the voltage to be added to $V_{CC}$ is +4 volts. As can be seen in FIG. 5, the voltage multiplier section 62 includes a plurality of multiplier stages, each clocked by complementary signals $\phi$ and $\bar{\phi}$. Each multiplier stage includes an N channel transistor $D_N$ and a capacitor $C_N$ connected between the transistor and one of the complementary signals $\phi$ and $\bar{\phi}$. The first transistor $D_0$ has its drain connected to the positive supply voltage $V_{CC}$ and its gate connected to one terminal of capacitor $C_0$. The remaining transistors $D_1$–$D_N$ are connected as diodes, with their gates and drains connected together. The capacitors $C_N$ are N channel transistors having their drain and source connected together to form one capacitor terminal and with the gate forming the other capacitor terminal. As is well known, signals $\phi$ and $\bar{\phi}$ alternately charge the capacitors $C_N$, with capacitor discharge being prevented since discharge current cannot flow in the reverse direction through the diode-connected transistors $D_N$.

The voltage output of the voltage multiplier section 62 on line 61 is connected to the input of a regulator circuit 64. The regulator circuit monitors the voltage output of the voltage multiplier section 62 and adjusts the frequency of the oscillator section 60 in response. In the event the voltage output is too great, the frequency is reduced and in if the output is too small, the frequency is increased.

The regulated output voltage is coupled to a control circuit which includes P channel transistors 66, 68 and 70 and N channel transistor 72. When the positive voltage applied to the source line $S_{LN}$ during an erase operation (FIG. 3) is to be provided by the voltage multiplier section 62 of the charge pump, a signal $\overline{\text{Pump Enable}}$ and a signal $\overline{\text{Erase}}$ are both made active (low) thereby turning on transistors 66 and 70. In addition, signal Read or Program is made inactive (low) thereby turning off transistor 72. Accordingly, the voltage output of the multiplier circuit section 62 is forwarded to the voltage switch 36 and then to the source line SLN. If a read or program operation is taking place, signal $\overline{\text{Erase}}$ is made inactive (high) and signal Read or Program is made active so that transistor 70 will be turned off and transistor 72 will be turned on. Accordingly, the source line SLN will be connected to the circuit common by transistor 72. Transistor 72 is made large so that it is capable of conducting the large cell currents in program operations.

In the event the source line SLN erase voltage is to be supplied by an external supply, the $\overline{\text{External Supply Enable}}$ signal is made active (low) thereby turning on transistor 68 and the $\overline{\text{Pump Enable}}$ signal is made inactive (high) thereby turning off transistor 66. The external supply voltage on line 69 is then coupled to the source line SLN during erase operations. By way of example, when voltage VSE is generated as depicted in the FIG. 6 timing diagram (waveform 52), the voltage is at +5 volts from time $T_1$ to $T_2$. Preferably, this portion of the waveform is generated by applying the primary supply output voltage $V_{CC}$ to the external supply line 69 and by making the External Supply signal active and by making the $\overline{\text{Pump Enable}}$ signal inactive. This will cause transistor 66 to turn off and transistor 68 to turn on so that the signal applied to the source line SL will be voltage $V_{CC}$. As previously noted, the primary supply voltage $V_{CC}$ will have the capability of sourcing the high initial current required during the first part of the erase operation. At time $T_2$, the primary supply voltage is replaced with the +9 volt output of the charge pump circuit by rendering signals $\overline{\text{External Supply Enable}}$ and $\overline{\text{Pump Enable}}$ inactive and active, respectively.

Thus, a novel memory system having fast erase capabilities has been disclosed. Although one embodiment has been described in some detail, it is to be understood that certain changes can be made by those skilled in the art without departing from the spirit and scope of the invention as defined by the appended claims. By way of example, the subject invention could be used in a memory system having separate erase blocks which can be independently erased. In that event, each erase block would be preferably divided into a plurality of erase segments as previously described.

What is claimed is:

1. A method of erasing memory cells having respective sources, drains, and control gates, the method comprising:

applying a negative voltage relative a common voltage to the control gate of one or more of the cells beginning at a first time; and applying a positive voltage relative the common voltage to the source of each of the one or more cells beginning at a second time at least ten microseconds after the first time, wherein applying the positive voltage comprises generating the positive voltage from a primary supply voltage having a magnitude less than that of the positive voltage.

2. A method of erasing memory cells having respective sources, drains, and control gates, the method comprising:

applying a negative voltage relative a common voltage to the control gate of one or more of the cells beginning at a first time;

applying a positive voltage relative the common voltage to the source of each of the one or more cells beginning at a second time at least ten microseconds after the first time, wherein applying the positive voltage comprises generating the positive voltage from a primary supply voltage having a magnitude less than that of the positive voltage;

applying the primary supply voltage to the source of each of the one or more cells beginning at a third time between the first and second times and at least one microsecond after the first time; and terminating the application of the primary supply voltage to the source of each of the one or more cells at the second time.

3. A method of erasing memory cells having respective sources, drains, and control gates, the method comprising:

applying a negative voltage relative a common voltage to the control gate of one or more of the cells beginning at a first time;

generating a first positive voltage relative the common voltage from a second positive voltage having a magnitude less than that of the first positive voltage, wherein generating the first positive voltage comprises operating a charge pump circuit, and the second positive voltage is the primary supply voltage of an integrated circuit comprising the memory cells; and applying the first positive voltage to the source of each of the one or more cells beginning at a second time subsequent to the first time.

4. A method of erasing memory cells having respective sources, drains, and control gates, the method comprising:

applying a first voltage having a first polarity relative a common voltage to the control gate of one or more of the cells beginning at a first time; and applying a second voltage having a second polarity relative the common voltage to the source of each of the one or more cells beginning at a second time different from the first time.

5. The method of claim 4, wherein the first polarity is negative and the second polarity is positive.

6. A method of erasing memory cells having respective sources, drains, and control gates, the method comprising:

applying a first voltage having a first polarity relative a common voltage to the control gate of one or more of the cells beginning at a first time; and applying a second voltage having a second polarity relative the common voltage to the source of each of the one or more cells beginning at a second time at least ten microseconds after the first time, wherein applying the first voltage comprises generating the first voltage from a primary supply voltage having a magnitude less than that of the second voltage.

7. The method of claim 6, wherein the first polarity is negative and the second polarity is positive.

8. A method of erasing memory cells having respective sources, drains, and control gates, the method comprising:

applying a first voltage having a first polarity relative a common voltage to the control gate of one or more of the cells beginning at a first time;

applying a second voltage having a second polarity relative the common voltage to the source of each of the one or more cells beginning at a second time at least ten microseconds after the first time, wherein applying the second voltage comprises generating the second voltage from a primary supply voltage having a magnitude less than that of the second voltage;

applying the primary supply voltage to the source of each of the one or more cells beginning at a third time between the first and second times and at least one microsecond after the first time; and terminating the application of the primary supply voltage to the source of each of the one or more cells at the second time.

9. The method of claim 8, wherein the first polarity is negative and the second polarity is positive.

10. A method of erasing memory cells having respective sources, drains, and control gates, the method comprising:

applying a first voltage having a first polarity relative a common voltage to the control gate of one or more of the cells beginning at a first time;

generating a second voltage having a second polarity relative the common voltage from a third voltage having the second polarity relative the common voltage and having a magnitude less than that of the second voltage, wherein generating the second voltage comprises operating a charge pump circuit, and the third voltage is the primary supply voltage of an integrated circuit comprising the memory cells; and applying the second voltage to the source of each of the one or more cells beginning at a second time subsequent to the first time.

11. The method of claim 10, wherein the first polarity is negative and the second polarity is positive.

* * * * *

UNITED STATES PATENT AND TRADEMARK OFFICE
CERTIFICATE OF CORRECTION

PATENT NO.  : 6,243,299 B1
DATED       : June 5, 2001
INVENTOR(S) : Darrell D. Rinerson, Roger R. Lee, Christophe J. Chevallier It is certified that error appears in the above-identified patent and that said Letters Patent is hereby corrected as shown below:

Title page,
"Darrell D. Rinerson, Cupertino; Roger R. Lee, Boise; Christophe J. Chevallier, Palo Alto, all of CA (US) should read -- Darrell D. Rinerson, Cupertino; Christophe J. Chevallier, Palo Alto, both of CA (US); Roger R. Lee, Boise, ID (US) --.

Column 2,
Line 36, insert -- , -- between "cells" and "all".

Column 3,
Line 39, insert -- , -- between "voltage" and "it".

Column 4,
Line 3, insert -- the -- between "to" and "control".
Line 64, "and" should read -- an --.

Column 5,
Line 42, "connected" should read -- connect --.
Line 46, delete "," between "the" and "address".
Line 57, insert -- the -- between "if" and "cell".

Column 6,
Line 47, insert -- in -- between "disclosed" and "an"

Column 7,
Line 39, delete "is" between "indicated" and "by".
Line 65, "reduce" should read -- reduced --.

UNITED STATES PATENT AND TRADEMARK OFFICE
CERTIFICATE OF CORRECTION

PATENT NO. : 6,243,299 B1
DATED : June 5, 2001
INVENTOR(S) : Darrell D. Rinerson, Roger R. Lee, Christophe J. Chevallier It is certified that error appears in the above-identified patent and that said Letters Patent is hereby corrected as shown below:

<u>Column 8,</u>
Line 24, delete "is" between "that" and "can".

Signed and Sealed this

Fourth Day of December, 2001

Attest:

*Attesting Officer*

NICHOLAS P. GODICI
*Acting Director of the United States Patent and Trademark Office*